US005487852A

United States Patent [19]
Ludden et al.

[11] Patent Number: 5,487,852
[45] Date of Patent: Jan. 30, 1996

[54] LASER-MACHINING POLYMERS

[75] Inventors: Michael J. Ludden, Swindon; Richard J. Penneck, Lechlade; Nicholas J. G. Smith, Cricklade, all of England

[73] Assignee: Raychem Limited, Swindon, England

[21] Appl. No.: 548,962

[22] PCT Filed: Feb. 3, 1989

[86] PCT No.: PCT/GB89/00109

§ 371 Date: Feb. 26, 1991

§ 102(e) Date: Feb. 26, 1991

[87] PCT Pub. No.: WO89/07337

PCT Pub. Date: Aug. 10, 1989

[30] Foreign Application Priority Data

Feb. 5, 1988 [GB] United Kingdom ............... 88025685
Dec. 2, 1988 [GB] United Kingdom ............... 8828245

[51] Int. Cl.⁶ .................................................. B23K 26/00
[52] U.S. Cl. .......................... 264/400; 264/154; 264/156; 264/482; 219/121.71; 219/121.72
[58] Field of Search .............................. 264/22, 154, 156, 264/25; 156/643, 646; 219/121.68, 121.71, 121.72

[56] References Cited

U.S. PATENT DOCUMENTS

| | | | |
|---|---|---|---|
| 3,790,744 | 2/1974 | Bowen | 264/22 |
| 4,414,059 | 11/1983 | Blum et al. | 156/643 |
| 4,417,948 | 11/1983 | Mayne-Banton | 156/643 |
| 4,617,085 | 10/1986 | Cole, Jr. et al. | |
| 4,780,177 | 10/1988 | Wojnarowski et al. | 156/643 |
| 4,857,382 | 8/1989 | Liu et al. | 156/643 |
| 4,877,644 | 10/1989 | Wu et al. | 156/643 |
| 4,915,981 | 4/1990 | Traskos et al. | 156/643 |
| 5,075,195 | 12/1991 | Babler et al. | 264/22 |
| 5,175,043 | 12/1992 | Yabe et al. | 156/643 |
| 5,207,955 | 5/1993 | Esfom et al. | 264/22 |

Primary Examiner—Mathieu Vargot
Attorney, Agent, or Firm—Sheri M. Novack; Herbert G. Burkard

[57] ABSTRACT

Article and method of making same by laser-ablation-machining of (a) aromatic and/or amorphous polyamide material, or (b) polymeric material having repeating in its polymer backbone aromatic rings and aliphatic chains (with the proviso that the aliphatic chains have at least 4 carbon atoms when the material is a polyester, and preferably in all cases U.V. laser radiation is preferred, preferably at wavelengths greater than 248 nm from a KrF or XeCl excimer laser. The preferred polyamides, polyetheresters, and polyimides have superior machining performance and may be useful for making uniaxially electrically conductive articles by machining holes cleanly through laminar sheets of the preferred polymers, which sheets are subsequently metal plated.

26 Claims, No Drawings

LASER-MACHINING POLYMERS

This invention relates to laser-machining of polymeric materials and to laser-machined articles so produced.

BACKGROUND OF THE INVENTION

U.S. Pat. No. 4,617,085 describes a method for removing organic material from an organic film by ablative photodecomposition using ultraviolet light of wavelength 193 nanometers from an ArF excimer laser. The rate of removal is said to be substantially enhanced by the use of polymer blends or copolymers in which aliphatic vinyl polymer units such as acrylates or methacrylates, are present together with aromatic vinyl polymer units having pendant aromatic rings, such as styrenes, vinyltoluenes or vinylbiphenyls.

SUMMARY OF THE INVENTION

The present invention relates to classes of polymers possessing superior laser-machining characteristics, optionally together with advantageous equipment and/or wavelengths, to produce laser-machined articles with reduced (preferably without) charring of the polymer. Absence of charring is advantageous since char tends to contaminate the surrounding polymer surface, making clean processing very difficult, e.g. for electronic microcircuits.

A first aspect of the invention accordingly provides a laser-ablation-machined article at least partly composed of (a) aromatic and/or amorphous polyamide material, or (b) polymeric material having repeating in its polymer backbone aromatic rings and aliphatic chains (with the proviso that the aliphatic chains have at least 4, preferably at least 6, more preferably at least 8, carbon atoms when the material is a polyester, and preferably in all cases). A second aspect of the invention provides a method of making an article of polymeric material comprising laser-ablation-machining a body of polymeric material at a laser wavelength, power density, and energy fluence to remove portions of the said body, the said body being at least partly composed of (a) aromatic and/or amorphous polyamide material, or (b) polymeric material having repeating in its polymer backbone aromatic rings and aliphatic chains (with the proviso that the aliphatic chains have at least 4, preferably at least 6, more preferably at least 8, carbon atoms when the material is a polyester, and preferably in all cases). Polyesters will preferably have in the backbone an aliphatic chain of at least 4 carbon atoms between each aromatic nucleus in the backbone and the next aromatic nucleus in the backbone.

DETAILED DESCRIPTION OF THE PREFERRED EMBODIMENTS

It will be understood that many of the polymeric materials used in the articles or methods according to this invention have aromatic rings in the polymer backbone chain, which gives the present polymers characteristics different from those of the class of polymers with merely pendant aromatic rings described in the aforementioned U.S. patent. The present polymers are well suited to laser-ablation-machining or processing, by which term is meant any process of forming, shaping, cutting, perforating, etching, marking, patterning or otherwise altering any physical dimensions of a body of polymeric material by applying laser radiation thereto so as to cause ablative photodecomposition of the polymeric material, the radiation being either in a narrow beam or spread over a wider area.

The laser radiation may be of any wavelength capable of producing the desired ablation machining effect, and references hereinafter to the laser radiation as "light" are not intended to indicate any specific range of radiation wavelengths. Ultraviolet laser light is preferred, especially at wavelengths below 400 nanometers. Wavelengths of particular interest include those produced by excimer lasers, for example 351, 337, 308, 249, 222, 193 and 157 nanometers, the choice depending to some extent on the application. For example, 193 nm allows resolution of very fine details, while wavelengths of 248 nm or more, preferably of 308 nm, permit wider choice of optical media and need not be transmitted in vacuo, since they are not significantly absorbed by air. Light of 308 nanometers wavelength, preferably from an XeCl excimer laser, is especially useful, the gases in such a laser having a much longer working life than most other known gas systems. KrF excimer laser light at 249 nm is also useful, e.g. for finer lithographic features or to avoid the need to add chromophores to some polymers.

The polymers specified for the articles and methods of the present invention are the aforesaid polyamides and/or have in their backbone aromatic rings and aliphatic chains, by which term is meant (subject to the aforesaid proviso for polyesters) chains of at least 2, preferably at least 4, and often more than 6, 8, or 10, carbon atoms forming part of the polymer backbone, excluding any carbonyl carbon atoms and any pendant aliphatic groups which may be attached. Cyclic aliphatic chains are included in the term. When pendant aliphatic groups are included, the backbone chain plus the pendant groups will comprise at least 3, preferably at least 5, and often at least 7, 9 or 11 carbon atoms in total.

The specified polymers having this combination of aromatic rings and aliphatic chains in their backbone, have been found to be laser-ablation-machinable with little or no charring.

The specified polymers may for example be selected from polyetheresters, the aforesaid polyamides, and polyimides. The polymers may be doped with appropriately chromophoric materials which enhance the laser-machining effect, for example aromatic carbonyl compounds, one example of which is benzophenone.

In one form of the invention, the articles and methods use a class of the specified polymers which tend not to require doping, these being the polyetheresters, especially polyetherester block copolymers, preferably having the specified aromatic rings in the backbone of the ester blocks. The preferred copolymers also have aliphatic chains in the backbone of the ester blocks. The preferred copolymers may have aliphatic chains and no aromatic rings in the backbone of the ether blocks. The aliphatic chains in the preferred copolymers preferably contain 4 carbon atoms, more preferably 4 methylene groups, and an especially preferred copolymer is a polyetherester comprising polyester blocks of repeat unit formula

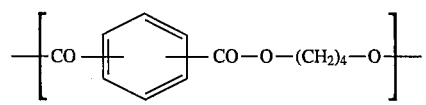

and polyether blocks of repeat unit formula

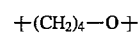

In another form of the invention, the articles and methods use polyamides, which may be aromatic polyamides having in the polymer backbone aromatic rings, preferably derived from a phthalic acid, and/or may be amorphous polyamides, preferably having in its backbone aromatic rings and aliphatic chains. Specifically preferred polyamides include (A) polyamides based on the condensation of terephthalic acid with trimethylhexamethylene diamine (preferably containing a mixture of 2,2,4- and 2,4,4-trimethylhexamethylene diamine isomers), or (B) polyamides formed from the condensation of one or more bisaminomethylnorbornane isomers with one or more aliphatic, cycloaliphatic or aromatic dicarboxylic acids e.g. terephthalic acid and optionally including one or more amino acid or lactam e.g. epsilon-caprolactam comonomers, or (C) polyamides based on units derived from laurinlactam, isophthalic acid and bis-(4-amino-3-methylcyclohexyl) methane, or (D) polyamides based on the condensation of 2,2-bis-(p-aminocyclohexyl) propane with adipic and azeleic acids, and polyamides based on the condensaton of trans cyclohexane-1,4-dicarboxylic acid with the trimethylhexamethylene diamine isomers mentioned in (A) above, or (E) polyamides based on units derived from m-xylylenediamine and adipic acid, and especially those wherein the polyamides is amorphous.

Other examples include but are not limited to, amorphous polyamides defined by one of the following generic formulas

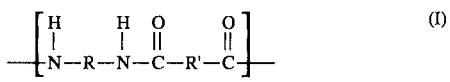

Provided that some R or R' groups are aromatic rings and some are aliphatic chains, each R and R' can independently be an alkylene radical having broadly about one to about 30 carbon atoms, preferably about two to about 20 carbon atoms and most preferably about two to about 10 carbon atoms, or a cycloalkylene or arylene radical having broadly about 3 to about 30 carbon atoms, preferably about two to about 20 carbon atoms, and most preferably about two to about 10 carbon atoms, or a mixed alkyl-cycloalkyl radical having broadly from about 4 to about 30 carbon atoms, preferably about four to about 20 carbon atoms more preferably about four to about 10 carbon atoms, or R can also be represented by structure (II)

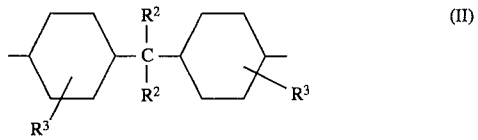

Each $R^2$ and $R^3$ in the above formula independently represents hydrogen or an alkyl radical having broadly from one to about 15 carbon atoms, preferably about one to about five carbon atoms, a cycloalkyl radical having from about 3 to about 16 carbon atoms, preferably about five to about 10 carbon atoms, a mixed alkylcycloalkyl radical having from about 6 to about 20 carbon atoms, preferably about 6 to about 10 carbon atoms. In a preferred embodiment, each $R^2$ is methyl and each $R^3$ is hydrogen. Each n is a whole number and, preferably falls within the range of about 10 to about 500,000.

Examples of suitable polyamides may include amorphous polyamide derived from a 50:50 ratio of hexamethylene diamine and an equal mixture of terephthalic acid and isophthalic acid; amorphous polyamide derived from isophthalic acid/bis(4-amino-3-methylcyclohexyl) methane/lauryl lactam; and amorphous polyamide derived from dimethylterephthalate and a 50:50 mixture of 2,2,4- and 2,4,4-trimethylhexamethylene diamine, all of which have less than about 2% crystallinity, i.e., greater than 98% amorphous character, and the like and mixtures of any two or more thereof.

In those aspects of the invention where the machined surface comprises polyimides, it is preferred that the polymeric material comprises a polyimide having in its backbone aromatic rings derived from pyromellitimide. It may also be preferred that the polymeric material comprises a polyimide having in its backbone aliphatic chains of at least 10 carbon atoms, especially those wherein the polyimide is derived from 1,12-dodecamethylene pyromellitimide or 1,13-tridecamethylene pyromellitimide.

Other aromatic/aliphatic polymers which may be useful include polyesters, e.g. polyalkylene terephthalate and especially polytetramethylene terephthalate, and cycloaliphatic diol/terephthalic acid copolymers e.g. copolymers of terephthalate and isophthalate units with 1,4-cyclohexanedimethyloxy units, polysulphides, polyethers e.g. polybutylene ether copolymers, and especially polyether esters such as those having polytetramethylene ether and polytetramethylene terephthalate blocks.

Preferred copolyesters are the polyether ester polymers derived from terephthalic acid, polytetramethylene ether glycol and 1,4-butane diol. These are random block copolymers having crystalline hard blocks with the repeating unit:

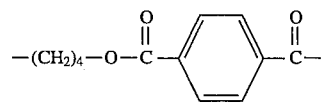

and amorphous, elastomeric polytetramethylene ether terephthalate soft blocks of repeating unit

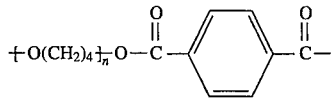

having a molecular weight of about 600 to 3000, i.e. n=6 to 40.

Other preferred polymers include those based on polyether and polyamide blocks, especially the so called a "polyether-ester amide block copolymers" of repeating units:

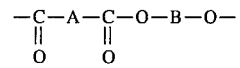

wherein A represents a polyamide sequence of average molecular weight in the range of from 300 to 15,000, preferably from 800 to 5000; and B represents a linear or branched polyoxyalkylene sequence of average molecular weight in the range of from 200 to 6000, preferably from 400 to 3000.

Preferably the polyamide sequence is formed from alpha, omega-aminocarboxylic acids, lactams or diamine/dicarboxylic acid combinations having $C_4$ to $C_{14}$ carbon chains, and the polyoxyalkylene sequence is based on ethylene glycol, propylene glycol and/or tetramethylene glycol, and the polyoxyalkylene sequence constitutes from 5 to 85%, especially from 10 to 50% of the total block copolymer by weight. These polymers and their preparation are described in UK Patent Specifications Nos. 1,473,972, 1,532,930, 1,555,644, 2,005,283A and 2,011,450A.

The polymer preferably has a C:H ratio of not more than 0.9, more preferably not more than 0.75, most preferably not more than 0.65 and especially not more than 0.55.

When the polymeric material is in the form of a sheet and through-holes are laser-machined through the sheet, the articles and methods of the present invention are applicable to making commercially valuable uniaxially electrically conductive articles of the kinds described in Published EP-A-0213774 or in copending British Patent Applications 8802567, 8802565, 8802566, 8815447.1, 8819895.7, and 8823053.7, the disclosures of all of which are incorporated herein by reference. For these purposes, especially useful embodiments of the articles and methods according to the invention are those wherein the laser-machined polymeric material comprises a laminar sheet having at least one layer of polyimide material and at least one layer of polyamide material, preferably a polyamide as hereinbefore described to avoid surface contamination as aforesaid.

Such laminar sheets may be useful for making uniaxially electrically conductive articles as described in published European Patent Application EP-A-0123774, or in aforesaid copending British Patent Applications. For such purposes, a preferred polyimide is one which is capable of retaining at least 50%, preferably at least 75%, more preferably at least 85%, of its original elongation after immersion in water of pH10 at 100° C. for 4 days according to ASTM D882. It will be readily understood that a sufficiently fully cyclised polyimide having less than 15%, preferably less than 10%, more preferably less than 5%, and if possible substantially no open imide rings or uncyclised amic acid groups may be better able to survive hot alkaline metal plating baths than incompletely cyclised polyimides such as Kapton™. Preferably, the polyimide whether fully cyclised or not is derived from polymerisation of 4,4'-biphenyl dianhydride and (4,4'-diaminobiphenyl, or 4,4'-diaminobiphenylether, or phenylenediamine), any charring of the polyimide being less significant in these laminates since the polyimide need not be on the surface of the laminate exposed to the drilling laser.

The currently more preferred commercially available polyimides are those available under the Trade Mark "UPILEX" from Ube/ICI. One of these, "UPILEX R", is believed to be a relatively completely cyclised polymer having a repeat unit derived from diphenyl dianhydride and diaminodiphenylether, viz.

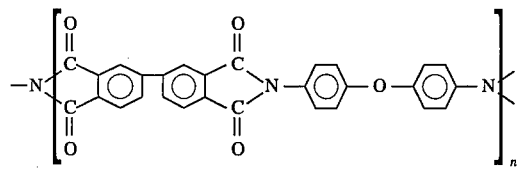

Most preferred, however, is "UPILEX S", which is believed to have a repeat unit derived from the same anhydride and phenylene diamine, viz.

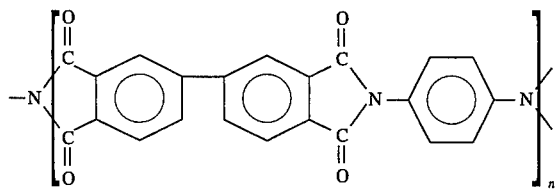

The invention may also be especially useful in forming photo-resists (e.g. for producing microcircuits or flexible circuit boards) comprising a laser-machined article as herein described in the form of a layer, using the laser-machining methods herein described. For this purpose, the solvent-castable or spin-coatable amorphous polymeric materials are especially advantageous.

Some of the polymers unexpectedly have the additional advantage of being cross-linkable by U.V. light when applied at power densities below those needed for laser-machining. This may be especially useful in forming photoresists, whether or not also laser-machined.

The invention is further illustrates by the following specific examples, in which the indicated polymers were laser-machined at room temperature in air at the indicated wavelengths, "NC" indicating absence of observable charring, S indicating slight or barely discernable charring, C indicating charring, and H indicating heavy charring. The Examples identified by C* after the Example Number are for comparison with the other Examples according to the invention.

COMPARISON EXAMPLES:

| Ex. No. | Type | Repeat Unit | 308 nm | 249 nm | 193 nm |
|---|---|---|---|---|---|
| 1* | Aromatic polyester | −OC−C₆H₄−CO−O−CH₂CH₂−O− | C | C | C |
| 2* | Aromatic polyester | −OC−C₆H₄−CO−O−C₆H₄−C(CH₃)₂−C₆H₄−O− | C | — | — |
| 3 | Aromatic polyester | −OC−C₆H₄−CO−O−(CH₂)₄−O− | S | — | — |
| 4 | Aromatic polyester | −OC−C₆H₄−CO−O−(CH₂)₂−O−CO−C₆H₄−CO−O−CH₂−C₆H₁₀−CH₂−O− | S | — | — |
| 5 | Aromatic polyether-ester | −OC−C₆H₄−CO−O−(CH₂)₄−O−C₆H₄−C(CH₃)₂−C₆H₄−O−[(CH₂)₄O]₁₄− | NC | NC | NC |
| 6* | Aromatic polysulphone | −C₆H₄−SO₂−C₆H₄−O− | H | H | H |
| 7* | Polyaryletherketone | −C₆H₄−CO−C₆H₄−O−C₆H₄−O− | H | H | H |
| 8* | Aromatic polyimide | (pyromellitic diimide with diphenyl ether) | H | H | H |

-continued

COMPARISON EXAMPLES:

| Ex. No. | Type | Repeat Unit | 308 nm | 249 nm | 193 nm |
|---|---|---|---|---|---|
| 90* | Aromatic polyimide | (structure: aromatic polyimide with diphenyl ether) | H | H | H |
| 10 | Aromatic polyamide | $-NH-CH_2-\phi-CH_2NH-C(=O)-(CH_2)_4-C(=O)-$ | NC | NC | NC |
| 11 | Aromatic polyamide | $-C(=O)-\phi-C(=O)-NH-CH_2CH_2-C(CH_3)_2-CH_2-CH(CH_3)-CH_2NH-$ | NC | NC | NC |
| 12 | Aromatic polyamide | (structure with cyclohexyl-CH₂-cyclohexyl and benzamide linkages) | NC | NC | NC |
| 13 | Aromatic/aliphatic polyimide | (pyromellitimide with $-(CH_2)_{12}-$) | NC | NC | NC |
| 14 | Aromatic/aliphatic polyimide | (pyromellitimide with $-(CH_2)_{13}-$) | NC | NC | NC |

-continued

COMPARISON EXAMPLES:

| Ex. No. | Type | Repeat Unit | 308 nm | 249 nm | 193 nm |
|---|---|---|---|---|---|
| 15*C | Aromatic polyether-imide | (structure: bisphenol-A bridged bis-phthalimide with phenylene linker) | H | H | H |
| 16 | Aromatic polyether-amide | (see below) | NC | NC | NC |
| 17*C | Polystyrene | —CH—CH$_2$— with phenyl | S | S | C |
| 18 | Parylene | —CH$_2$—CH$_2$— with phenyl | NC | — | — |

The commercially available aromatic polyetheramide of Example 16 comprises a polyamide sequence formed from alpha, omega-aminocarboxylic acids, lactams or diamine/dicarboxylic acid combinations having $C_4$ to $C_{14}$ carbon chains, and a polyoxylalkylene sequence based on ethylene glycol, propylene glycol and/or tetramethylene glycol, and the polyoxyalkylene sequence constitutes from 5 to 85%, especially from 10 to 50% of the total block copolymer by weight.

We claim:

1. A method of making an article of polymeric material comprising laser-ablation-machining a body of polymeric material at a laser wavelength, power density, and energy fluence sufficient to remove portions of the body, the body comprising low to zero-charring material selected from the group consisting of:

(a) polyamide material which is aromatic or amorphous or both;

(b) polymer having in its polymer backbone aromatic rings and aliphatic chains, the polymer being selected from the group consisting of polyetheresters and polyimides; and (c) polyester material other than polyetheresters having in its polymer backbone aromatic rings, ester carboxylate groups and aliphatic chains between the carboxylate groups, which chains having at least 4 carbon atoms.

2. A method according to claim 1, wherein the polymeric material comprises a polyetherester block copolymer having ester blocks and having aromatic rings in the backbone of the ester blocks.

3. A method according to claim 2, the polyetherester also having aliphatic chains in the backbone of the ester blocks.

4. A method according to claim 1, the polyetherester being a poyetherester block copolymer of ether blocks and ester blocks having aliphatic chains and no aromatic rings in the backbone of the ether blocks.

5. A method according to claim 1 wherein at least some of the said aliphatic chains of polymer (b) contain at least four carbon atoms.

6. A method according to claim 2, wherein the polyetherester block copolymer comprises polyester blocks of repeat unit formula

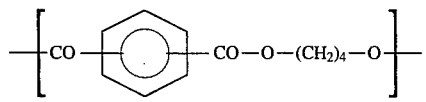

and polyether blocks of repeat unit formula

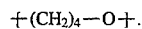

7. A method according to claim 1 wherein the polymeric material comprises an aromatic polyamide.

8. A method according to claim 7, wherein the aromatic polyamide has in its backbone aromatic rings derived from a phthalic acid.

9. A method according to claim 1, wherein the polymeric material comprises a polyamide (A) based on the condensation of terephthalic acid with trimethylhexamethylene diamine (preferably containing a mixture of 2,2,4- and 2,4,4-trimethylhexamethylene diamine isomers), or (B) formed from the condensation of one or more bis-aminomethylnorbornane isomers with one or more aliphatic, cycloaliphatic or aromatic dicarboxylic acids e.g. terephthalic acid and optionally including one or more amino acid or lactam e.g. gamma-caprolactam comopomers, or (C) based on units derived from laurinlactam, isophthalic acid and bis-(4-amino-3-methylcyclohexyl) methane, or (D) based on the condensation of 2,2-bis-(p-aminocyclohexyl) propane with adipic and azeleic acids, and polyamides based on the condensation of trans cyclohexane-1,4-dicarboxylic acid with the trimethylhexamethylene diamine isomers mentioned in (A) above, or (E) based on units derived from m-xylylenediamine and adipic acid.

10. A method according to claim 1, wherein the polymeric material comprises a polyimide having in its backbone aromatic rings derived from pyromellitimide.

11. A method according to claim 10, wherein the polymeric material comprises a polyimide having in its backbone aliphatic chains of at least 10 carbon atoms.

12. A method according to claim 10, wherein the polyimide is derived from 1,12-dodecamethylene pyromellitimide or 1,13-tridecamethylene pyromellitimide.

13. A method according to claim 1 wherein the laser-machined polymeric material is amorphous.

14. A method according to claim 1, including laser machining at a UV wavelength greater than 248 nanometers.

15. A method according to claim 14, including laser machining by means of an XeCl or KrF excimer laser.

16. A method according to claim 1, wherein the polymeric material is doped with an aromatic carbonyl compound to enhance the laser machining.

17. A method according to claim 1, wherein the laser-machined polymeric material comprises a laminar sheet having at least one layer of polyamide material and at least one layer of polyimide material.

18. A method according to claim 17, wherein the polyamide layer(s) comprise(s) a polyamide as specified in any of claims 7 to 9.

19. A method according to claim 17, wherein the polyimide layer(s) comprise(s) a polyimide as specified in any of claims 10 to 12.

20. A method according to claim 17 wherein the polyimide is derived from polymerization of 4,4'-biphenyl dianhydride and 4,4'-diaminobiphenyl, 4,4'-diaminobiphenylether, or phenylenediamine.

21. A method according to claim 17, wherein the polyimide material is capable of retaining at least 50% of its original elongation after immersion in water of pH10 at 100° C. for 4 days according to ASTM D882.

22. A method according to claim 1, wherein the polymeric material is in the form of a sheet and through-holes are laser-machined through the sheet.

23. A method according to claim 1, wherein the laser-machined polymeric material is spin-coated on a supporting substrate.

24. A method according to claim 1 wherein at least part of the polymeric material is cross-linkable and is cross-linked by exposure to laser light of lower power than that used for the laser-machining.

25. A method according to claim 1, wherein the laser-machined polymeric material is a polymeric photoresist layer.

26. A method according to claim 1, wherein the polymeric material has a C:H ratio of not more than 0.9.

* * * * *

UNITED STATES PATENT AND TRADEMARK OFFICE
CERTIFICATE OF CORRECTION

PATENT NO. : 5,487,852

INVENTOR(S) : Ludden et al.

DATED : January 30, 1996

It is certified that error appears in the above-identified patent and that said Letters Patent is hereby corrected as shown below:

Column 7, line 1 of data in table, replace "10*" by --1C*--.

Column 7, line 2 of data in table, replace "20*" by --2C*--.

Column 8, line 6 of data in table, replace "60*" by --6C*--.

Column 8, line 7 of data in table, replace "70*" by --7C*--.

Column 8, line 8 of data in table, replace "80*" by --8C*--.

Column 9, line 1 of data in table, replace "90*" by --9C*--.

Signed and Sealed this

Thirtieth Day of December, 1997

*Attest:*

BRUCE LEHMAN

*Attesting Officer*  *Commissioner of Patents and Trademarks*